United States Patent [19]
Ryu

[11] Patent Number: 5,216,294
[45] Date of Patent: Jun. 1, 1993

[54] DATA OUTPUT BUFFER USING A JUNCTION FIELD EFFECT TRANSISTOR

[75] Inventor: Je-Hwan Ryu, Suwon, Rep. of Korea

[73] Assignee: SamSung Electronics Co., Ltd., Suwon, Rep. of Korea

[21] Appl. No.: 851,497

[22] Filed: Mar. 16, 1992

Related U.S. Application Data

[63] Continuation-in-part of Ser. No. 359,703, May 31, 1989, abandoned.

[51] Int. Cl.⁵ ............................................. H03K 19/094
[52] U.S. Cl. .................................. 307/443; 307/446; 307/473; 307/263
[58] Field of Search ............... 307/443, 446, 458, 451, 307/473, 475, 870, 263, 303.2

[56] References Cited

U.S. PATENT DOCUMENTS

| | | | |
|---|---|---|---|
| 4,477,919 | 10/1984 | Borras et al. | 377/47 |
| 4,549,101 | 10/1985 | Sood | 307/443 |
| 4,567,378 | 1/1986 | Raver | 307/263 X |
| 4,604,731 | 8/1986 | Konishi | 307/475 X |
| 4,779,013 | 10/1988 | Tanaka | 307/448 X |

Primary Examiner—David R. Hudspeth
Attorney, Agent, or Firm—Robert E. Bushnell

[57] ABSTRACT

A data output buffer for use in a semiconductor memory with a junction-field-effect-transistor. The data output buffer has a N-channel MOSFET TN1 with its gate connected to terminal 10 for receiving data input DH from a logic circuit LC, a drain connected to power supply voltage $V_{cc}$ and a source connected to an output terminal 14. A N-channel MOSFET TN2 has a drain connected to the source of transistor TN1 and an output terminal 14, a source connected to a reference potential (e.g., a local ground) and a gate connected to the output of a CMOS inverter 20. A JFET JT has a drain connected to the power supply voltage Vcc, a source connected to the source of the P-channel MOSFET TP1 and a gate connected to a negative voltage $V_{BB}$. A drain of the P-channel MOSFET TP1 is connected to terminal 16. A N-channel MOSFET TN3 has a drain connected to the drain of transistor TP1 via terminal 16 and a source connected to a reference potential (e.g., a local ground). The gates of transistors TP1 and TN3 are commonly connected to terminal 12 to receive output data DL from the logic circuit LC.

11 Claims, 3 Drawing Sheets

DATA OUTPUT BUFFER USING A JUNCTION FIELD EFFECT TRANSISTOR

CROSS REFERENCE TO RELATED APPLICATIONS

This application makes reference to and claims the benefits available under Title 35 U.S.C. §§ 119 and 120 as a continuation-in-part of a U.S. patent application earlier filed in the U.S. Patent & Trademark Office on May 31, 1989 and assigned Ser. No. 07/359,703 abandoned.

BACKGROUND OF THE INVENTION

1. Field of the Invention

The invention relates to data output buffers for use in semiconductor memory system, and more particularly, to data output buffers implements a junction field effect transistor (hereinafter referred to as a JFET).

2. Description of the Prior Art

An output end of a semiconductor memory system employs a data output buffer in order to provide a TTL logic level. A conventional data output buffer uses a logic circuit for receiving output data from a memory cell via a sense amplifier and receives an output enable clock pulse for controlling the output. A N-channel pull-down MOSFET transistor has a drain connected to an output terminal.

In the data output buffer, when input data at the output terminal from a sensor amplifier is low and the output enable clock pulse is low, the output terminal has a high impedance, thereby isolating the semiconductor memory from circuitry connected to the output terminal to receive output data. A low level input and low level input enables transistors to conduct, thereby providing a logic low level for output. Due to certain timing features however, data of a high level may exist before the pull-down transistor is turned on, and a voltage level of invalid data at this time increases with the higher power supply voltage $V_{cc}$. Therefore, in the case that invalid data is at a high level and valid data is at a low level of the power supply voltage $V_{cc}$, a high VGS and VDS of the pull-down transistor causes a very high maximum value of current in the pull-down transistor and subsequently organization of $V_{ss}$ noise, and as result, variation of the output level and adverse operation of the circuitry connected to the output terminal It is desirable to minimize the channel width of a pull-down transistor coupled between the output terminal and $V_{ss}$ in order to prevent such $V_{ss}$ noise. Minimizing the channel width of transistor TN2, however, is concerned with the problem that an excess time is longer when the power supply voltage is at the low level, due to longer response time. Furthermore, the TTL low level output value at the output terminal is higher than zero level due to the higher voltage of the output data Do resulting from the greater turn-on resistance of the pull-down transistor.

In one draft to address such deficiencies, a permanent resistor is connected between the power supply voltage $V_{cc}$ and the source of a transistor interposed between $V_{cc}$ and the pull-down transistor in order to minimize noise when the output data is lowered. The application of such a resistor enables the $V_{ss}$ noise to be minimized by delaying the gating of the pull-down transistor, but delays the data excess time with almost all of the power supply voltage is unavoidable because the resistor holds a constant value; however, the value of the power supply voltage is variable. Therefore, there is a problem that the operational speed is delayed when the power supply voltage is at the low level.

SUMMARY OF THE INVENTION

It is one object of the current invention to provide an improved data buffer.

It is another object to provide a data buffer exhibiting an enhanced relationship between operational speed and amplitude of power supply voltage.

It is another object to eliminate the predescribed drawbacks by virtue of an advanced data output buffer using a junction field effect transistor (JFET).

To achieve these and other objects, a data buffer may use a pull-up transistor having a gate, a drain and source respectively connected with each of terminals for first input data, power supply voltage and data output; and inverter including a P-channel transistor having a gate, a source and drain respectively connected with each of terminals for first and second input data, the power supply voltage and data output, and an N-channel transistor having a gate, a drain and a source respectively connected with terminals for the second input data, data output and a reference voltage; and a pull-down transistor having a gate, a drain and source respectively connected with each of the terminals of inverter, the data output and reference voltage. The buffer ah a JFET provided between the power supply voltage $V_{cc}$ and the P-channel transistor TP1 in one embodiment, or in a second embodiment, a JFET provided between the P-channel transistor and the control electrode of the pull-down transistor.

BRIEF DESCRIPTION OF THE DRAWINGS

A more complete appreciation of this invention and many of the attendant advantages thereof will be readily apparent as the same becomes better understood by reference to the following detailed description when considered when considered in conjunction with the accompanying drawings in which like reference symbols indicate the same or similar components, and wherein.

DETAILED DESCRIPTION OF THE INVENTION

Figure 1:
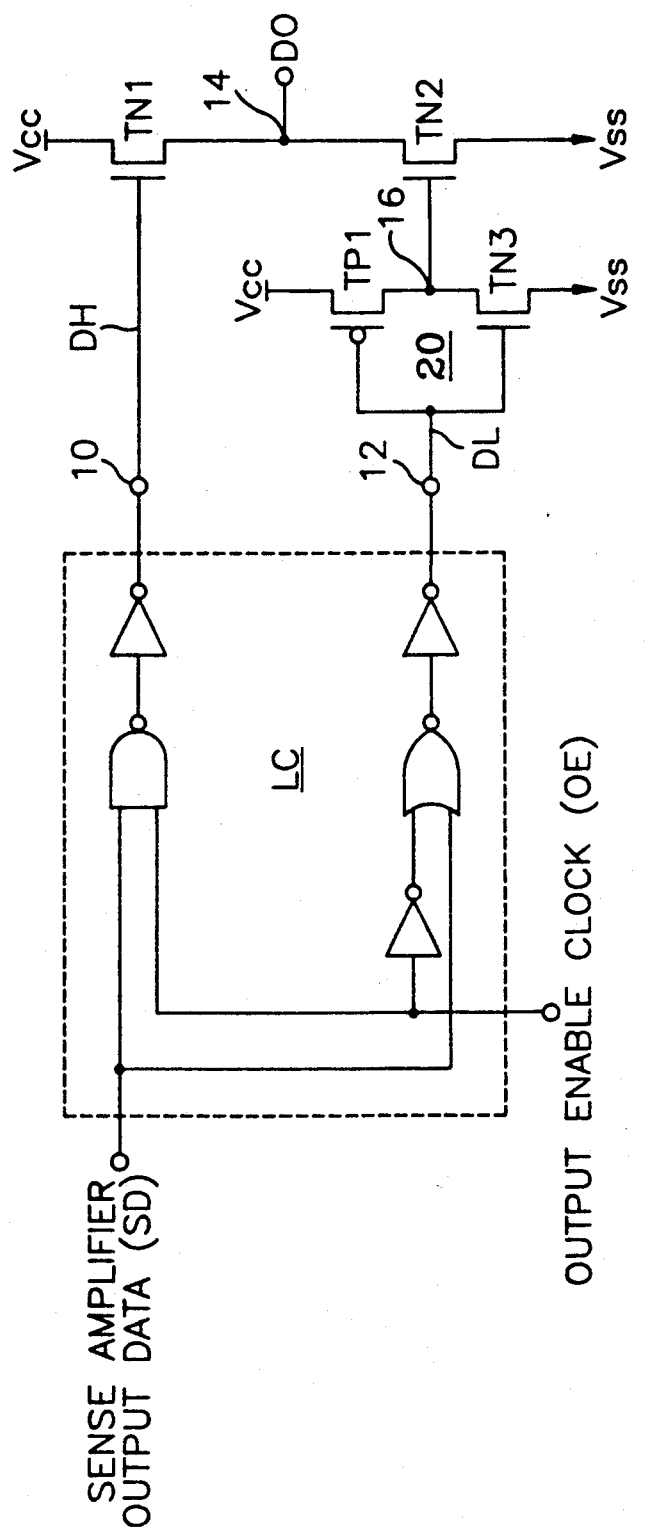
FIGS. 1 and 2 illustrate conventional data output buffers.

An output end of a semiconductor memory system employs a data output buffer in order to provide a TTL logic level. Referring now to the drawings, FIG. 1 illustrate a conventional data output buffer wherein the data output buffer uses a logic circuit LC for receiving output data from a memory cell via a sense amplifier (not shown) at input terminal SD. The logic circuit LC also receives an output enable clock pulse at terminal OE for controlling the outputs of the logic circuit LC. The output of the logic circuit LC are connected to terminals 10 and 12, respectively. The signal input and output of the logic circuit LC are illustrate in Table 1.

TABLE 1

| SD | OE | 10 | 12 |
|----|----|----|----|
| 0  | 0  | 0  | 1  |
| 0  | 1  | 0  | 0  |
| 1  | 0  | 0  | 1  |
| 1  | 1  | 1  | 1  |

A N-channel pull-up MOSFET TN1 has its gate connected to terminal 10 for receiving data input DH output from the logic circuit LC, a drain connected to power supply voltage $V_{cc}$ and a source connected to an output terminal 14. A N-channel pull-down MOSFET TN2 has a drain connected to the source of transistor TN1 and an output terminal 14, a source connected to a reference potential (ground) and a gate connected to the output of a CMOS inverter 20. The inverter 20 comprises a P-channel MOSFET TP1 having a source connected to the power supply voltage $V_{cc}$ and a drain connected to terminal 16, and a N-channel MOSFET TN3 having a rain connected to the drain of transistor TP1 via terminal 16 and a source connected to a reference potential (ground). The gates of transistors TP1 and TN3 are commonly connected to terminal 12 to receive output data DL from the logic circuit LC. Table 2 illustrates the input and responses of the circuit components connected to the output terminal of circuit LC.

TABLE 2

| DH | DL | TN1 | TN2 | TN3 | TP1 | Do |
|----|----|-----|-----|-----|-----|-----|
| 0  | 1  | OFF | OFF | ON  | OFF | HIGH IMP. |
| 0  | 0  | OFF | ON  | OFF | ON  | 0 |
| 0  | 1  | OFF | OFF | ON  | OFF | HIGH IMP. |
| 1  | 1  | ON  | OFF | ON  | OFF | 1 |

Note that the condition CH=1 and L=0 does not exist and further, there exists only the states DH=DL=1 and DH=DL=0 when the output enable clock pulse at terminal OE (Table 1) is at a logic high level.

In the data output buffer, when input data at terminal SD is low and the output enable clock pulse at terminal OE is low, the output terminal Do has a high impedance thereby isolating the semiconductor memory from circuitry connected to the output terminal 14 to receive output data Do. A low level input DL and low level input DH enables transistors TP1 and TN2 to conduct, thereby providing a logic low level for output at output terminal Do. Due to certain timing features however, data of a high level may exist at terminal 16 before transistor TN2 is turned on, and a voltage level of invalid data at this time increases with the higher power supply voltage $V_{cc}$. Therefore, if the invalid data is at a high level and valid data is at a low level of the power supply voltage $V_{cc}$, a high VGS and VDS of transistor TN2 causes a very high maximum value of current in transistor TN2 and subsequently organization of $V_{ss}$ noise, and, as a result, variation of the output level and adverse operation of the circuitry connected to the output terminal 14. Thus, the channel width of the pull-down transistor TN2 should be designed small in order to prevent such $V_{ss}$ noise. Minimizing the channel width of transistor TN2, however, requires consideration of the problem that an excess time is longer when the power supply voltage is at the low level, due to longer response time. Furthermore, the TTL low level output value at terminal 14 is higher than a zero level due to the higher voltage of the output data Do resulting from the greater turn-on resistance of transistor TN2.

Figure 2:
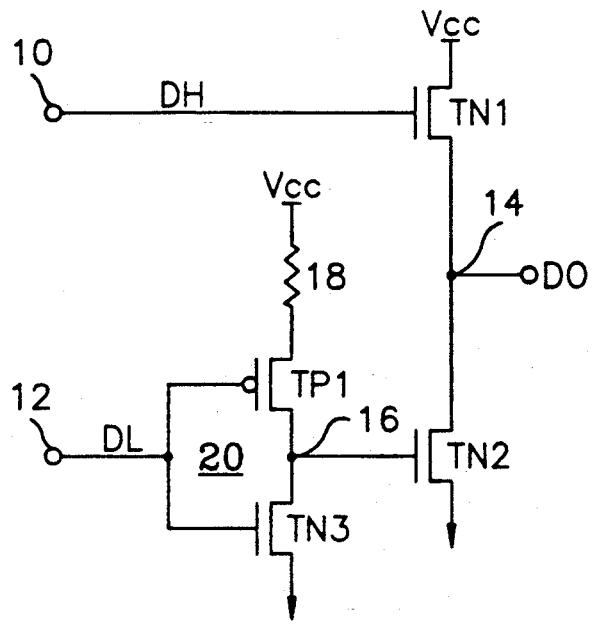

FIG. 2 illustrates a modification of the data buffer of FIG. 1 wherein a permanent resistor 18 is connected between the power supply voltage $V_{cc}$ and the source of the transistor TP1 in order to minimize noise when the output data is lowered. The application of such a resistor enables the $V_{ss}$ noise to be minimized by delaying the gating of the pull-down transistor TN2. Delaying the data excess time with almost all of the power supply voltage is unavoidable because the resistor 18 holds a constant value; however, the value of the power supply voltage is variable. Therefore, as in FIG. 1, there is a problem in FIG. 2 that the operational speed is delayed when the power supply voltage is at its low level.

Figure 3:
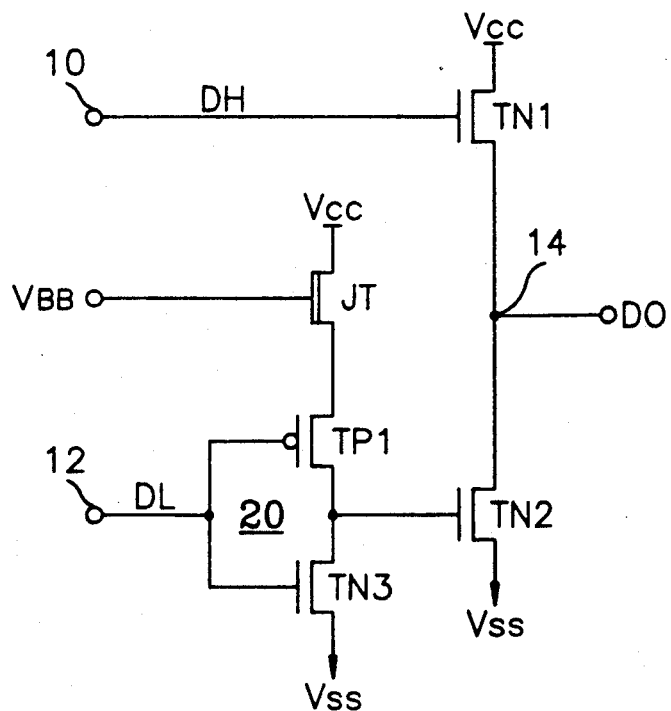
FIG. 3 is a circuit diagram showing one embodiment of a data output buffer utilizing a junction field effect transistor according to the present invention.

FIG. 3, turning now to a circuit diagram illustrates a preferred embodiment of a data output buffer according to the present invention. It should be noted that the same components as depicted in FIG. 1 have been illustrated with the same reference numerals/symbols and that the logic circuit LC, though not shown in FIG. 3, is still connectable as a component part of the output data buffer.

As shown in FIG. 3, a N-channel pull-up MOSFET TN1 has its gate connected to terminal 10 for receiving data input DH from the logic circuit LC, a drain connected to power supply voltage $V_{cc}$ and a source connected to an output terminal 14. A N-channel pull-down MOSFET TN2 has a drain connected to the source of transistor TN1 and an output terminal 14, a source connected to a reference potential (e.g., ground) and a gate connected to the output of a CMOS inverter 20. The JFET JT has a drain connected to the power supply voltage $V_{cc}$, a source connected to the source of the P-channel MOSFET TP1 and a gate connected to a negative voltage $V_{BB}$. A drain of the P-channel MOSFET TP1 is connected to terminal 16. A N-channel MOSFET TN3 has a drain connected to the drain of transistor TP1 via terminal 16 and a source connected to a reference potential (e.g., ground). The gates of transistors TP1 and TN3 are commonly connected to terminal 12 to receive output data DL from the logic circuit LC. Table 3 present the operational and logical states of the several transistor and nodes shown in FIG. 3.

TABLE 3

| SD | OE | DH | DL | TN₁ | TN₂ | TN₃ | TP₁ | Do |
|----|----|----|----|-----|-----|-----|-----|-----|
| 0  | 0  | 0  | 1  | OFF | OFF | ON  | OFF | High Impedance |
| 0  | 1  | 0  | 0  | OFF | ON  | OFF | ON  | Low |
| 1  | 0  | 0  | 1  | OFF | OFF | ON  | OFF | High Impedance |
| 1  | 1  | 1  | 1  | ON  | OFF | ON  | OFF | High |

Figure 4:
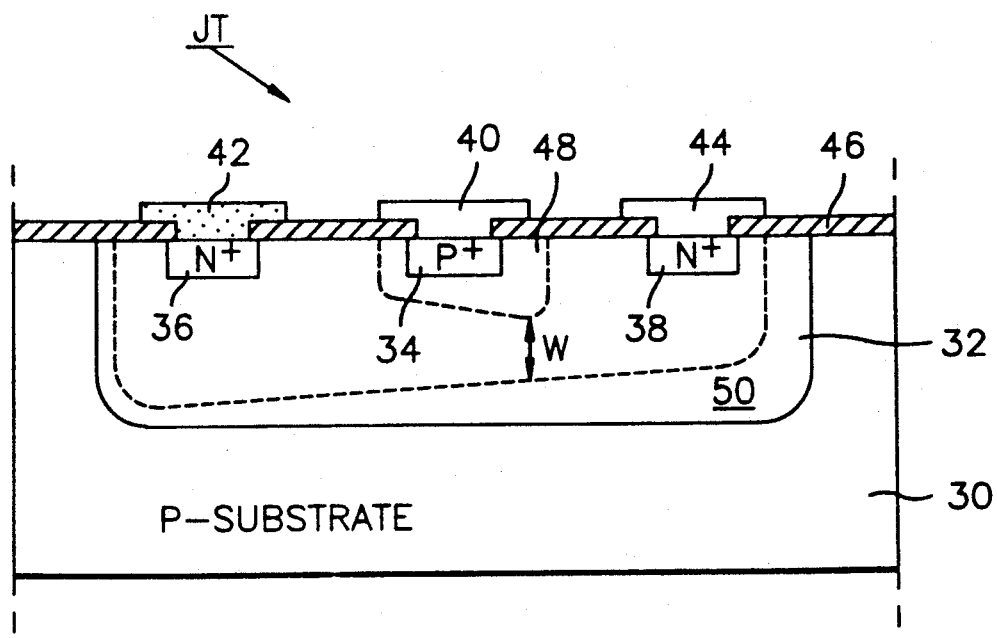
FIG. 4 is a sectional view showing the structure of the junction field effect transistor according to the present invention.

The JFET (shown in greater detail in FIG. 4), in a CMOS semiconductor memory device, is formed in a n-type well 32 diffused on a p-type substrate 30, wherein there are formed N+ source region 36 and N+ drain region 38 in well 32, and a P+ gate region 34 formed between the source region 36 and drain region 38. The voltage $V_{BB}$ is applied to agate electrode conductor 40 connected with the p-type substrate 30 and gate region 34. The power supply voltage $V_{cc}$ is applied to the drain region 38 through a drain electrode conductor 44, and a source electrode conductor 42 is coupled between the source region 36 and the source of the transistor TP1. The negative voltage $V_{BB}$ can be produced from a back bias voltage generator of an ordinary memory system, so that $V_{BB}$ is called a back bias voltage.

In operation, the transistor JT in its linear region forms depletion regions 48 and 50 due to the back bias voltage $V_{BB}$ applied to the gate electrode 40 and substrate 30, and also due to the power supply voltage $V_{cc}$ applied to the drain electrode 44. Thus an increase of the power supply voltage $V_{cc}$ to the drain electrode 44 causes the depletion regions 48 and 50 to be extended (i.e., deformed), subsequently reducing the channel width. Therefore, the resistance value between the drain region 38 and the source region 36 increases.

Alternatively, if the power supply voltage $V_{cc}$ applied to drain electrode 44 is decreased, the channel resistance value of the JFET JT is reduced. The use of such a JFET in the linear region only prevents the operational speed from being reduced due to a small resistance with a low power supply voltage, but also causes the peak value of the current, which is flowing to the ground through the drain-to-source channel of the transistor TN2, to be reduced due to a greater resistance with the high power supply voltage, thereby reducing noise.

Therefore, the data output buffer of the present invention holds the advantage that, when the channel width of the transistor TN2 is reduced, the JFET JT improves operational speed and a reduction of $V_{ss}$ noise can be obtained.

Figure 5:
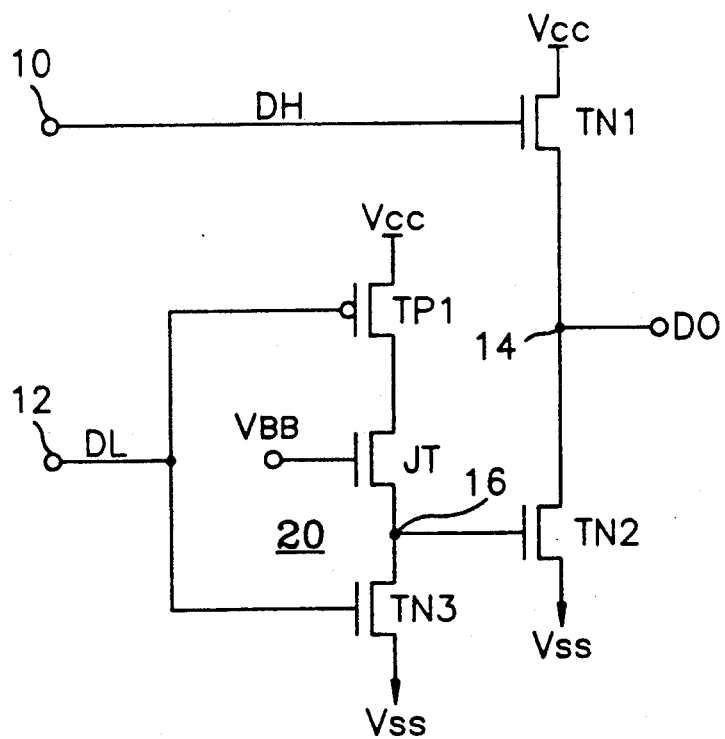
FIG. 5 is a circuit diagram showing another embodiment of a data output buffer utilizing a junction field effect transistor according to the present invention.

While the foregoing invention has been described with regard to the first embodiment, it is also possible for the source of the JFET JT to be coupled to the drain of transistor TP1 and for the source of the JFET FT to be coupled to terminal 16, as shown in FIG. 5.

The foregoing description shows only preferred embodiments of the present invention. Various modifications may be apparent to those skilled in the art without departing from the scope of the present invention which is only limited by the appending claims. Therefore, the embodiment shown and described is only illustrative, not restrictive.

I claim:

1. A data output buffer, comprising:
   a first data input terminal receiving first input data;
   a second data input terminal receiving second input data;
   a junction field effect transistor having a source, a drain connected to a power supply voltage terminal and a gate connected to a first voltage terminal;
   an inverter having N-channel and P-channel transistors with drain-to-source channels connected in series between a source of said junction field effect transistor and a reference voltage terminal, and gates connected with said second input terminal
   a pull-up transistor having a drain and source connected between the power supply voltage terminal and the data output terminal, and a gate connected to said first data input terminal; and
   a pull-down transistor having a drain and source connected between said data output terminal and said reference voltage terminal, and a gate connected to an output terminal of said inverter.

2. A data output buffer according to claim 1, wherein said junction field effect transistor is formed in a n-type well o n a p-type substrate.

3. A data output buffer according to claim 2, wherein a voltage applied to the gate of said junction field effect transistor and to the p-type substrate is a negative voltage relative to said reference voltage terminal.

4. A data output buffer according to claim 2, wherein a voltage applied to the first voltage terminal and to the p-type substrate is a negative voltage relative to said reference voltage terminal.

5. A data output buffer according to claim 4, wherein said negative voltage is a back bias voltage.

6. A data output buffer, comprising:
   a first data input terminal receiving first input data;
   a second data input terminal receiving second input data;
   a junction field effect transistor having a drain and source, and a gate connected to a first voltage terminal;
   a P-channel transistor having a source connected to a power supply terminal, a drain connected with the drain of said junction field effect transistor, and a gate connected to said second data input terminal;
   a N-channel transistor having a drain connected with a source of said junction field effect transistor, a source connected to a reference voltage terminal, and a gate connected to said second data input terminal;
   a pull-up transistor having a drain and source connected between the power supply terminal and a data output terminal, and a gate connected to said first data input terminal; and
   a pull-down transistor having a gate connected with a source of said junction field effect transistor, a drain connected to said data output terminal and a source connected to the reference voltage terminal.

7. A data output buffer, comprising:
   a first input terminal connectable for receiving first input data;
   a second data input terminal connectable for receiving second input data;
   a junction field effect transistor having a first one of a source electrode and a drain electrode connected to means for receiving a first potential, and having a gate electrode connected to means for receiving a second potential;
   an inverter having first type channel and second type channel transistors with drain-to-source channels connected in series between a second one of said source electrode and drain electrode of said junction field effect transistor and means for receiving a reference potential, and having gates of said first type channel and second type channel transistors connected to said second input terminal;
   a first output transistor having a first one of a drain electrode and a source electrode connected to the first one of said means for receiving the first potential and the second data input terminal, a second one of a drain electrode and a source electrode of said first output transistor connected to the second one of said means for receiving the first potential and the second data input terminal, and a gate connected to said first data input terminal; and
   a second output transistor having a first one of a drain electrode and source electrode connected to a first one of said data output and said means for receiving the reference voltage, having the second one of said drain electrode and source electrode of said second output transistor connected to the second one of said data output terminal and said means for receiving the reference voltage, and having a gate connected to an output terminal of said inverter.

8. A data output buffer according to claim 7, wherein said junction field effect transistor is formed in a n-type well on a p-type substrate.

9. A data output buffer according to claim 8, wherein a voltage applied to the gate of said junction field effect transistor and to the p-type substrate is a negative voltage relative to said reference potential.

10. A data output buffer according to claim 8, further comprised of said first output transistor and said second output transistor both transistors being of the same conductivity type.

11. A data output buffer according to claim 9, wherein said negative voltage is a back bias voltage.

* * * * *

UNITED STATES PATENT AND TRADEMARK OFFICE
CERTIFICATE OF CORRECTION

Page 1 of 3

PATENT NO. : 5,216,294
DATED : June 1, 1993
INVENTOR(S) : Je-Hwan Ryu

It is certified that error appears in the above-indentified patent and that said Letters Patent is hereby corrected as shown below:

Column 1   Line 6,   preceding "119", change "$\iint$" to -- §§ --;

Line 17,   after "memory", change "system" to -- systems --;

Line 30,   preceding "amplifier", change "sensor" to --sense--

Line 34-35,   after "input", delete "and low level input"

Column 2   Line 28,   after "buffer", change "ah" to --has--;

Line 40   after "description", delete "when considered" (the second occurrence)

UNITED STATES PATENT AND TRADEMARK OFFICE
CERTIFICATE OF CORRECTION

PATENT NO. : 5,216,294
DATED : June 1, 1993
INVENTOR(S) : Je- Hwan Ryu

It is certified that error appears in the above-indentified patent and that said Letters Patent is hereby corrected as shown below:

| | | |
|---|---|---|
| Column 2 | Line 62, | change "illustrate" to -- illustrates --; |
| | Line 68, | change "output" to -- outputs --; |
| Column 3 | Line 2, | change "illustrate" to -- illustrated --; |
| | Line 38, | change "CH=1" to -- DH=1 -- and, change "L=0" to -- DL=0 --; |
| Column 4 | Line 45, | after "Table 3", change "present" to -- presents --; |
| | Line 63 | preceding "electrode", change "agate" to -- a gate --; |

UNITED STATES PATENT AND TRADEMARK OFFICE
CERTIFICATE OF CORRECTION

PATENT NO. : 5,216,294
DATED : June 1, 1993
INVENTOR(S) : Je- Hwan Ryu

It is certified that error appears in the above-indentified patent and that said Letters Patent is hereby corrected as shown below:

| Column 5 | Line 18, | after "region", change "only" to -- not only --; |
| | Line 34, | after "JFET", change "FT" to -- JT --: |
| Column 5 | Line 66, | after "well", change "o n" to -- on --; |

<u>Claim 7</u>

| Column 6 | Line 63 | after "output", insert -- terminal --: |

Signed and Sealed this

Twelfth Day of September, 1995

Attest:

BRUCE LEHMAN

*Attesting Officer*     *Commissioner of Patents and Trademarks*